United States Patent [19]

Feder

[11] 4,292,562
[45] Sep. 29, 1981

[54] MOUNTING ARRANGEMENT FOR CRYSTAL ASSEMBLY

[75] Inventor: Alvin Feder, Lauderhill, Fla.

[73] Assignee: Motorola, Inc., Schaumburg, Ill.

[21] Appl. No.: 35,373

[22] Filed: May 3, 1979

[51] Int. Cl.³ .................................. H01L 41/08
[52] U.S. Cl. .............................. 310/348; 310/320; 310/366
[58] Field of Search ........................ 310/348–356, 310/366, 320

[56] References Cited

U.S. PATENT DOCUMENTS

| | | | |
|---|---|---|---|
| 3,488,530 | 1/1970 | Staudte | 310/348 |
| 3,527,967 | 9/1970 | Dyer et al. | 310/320 |
| 3,940,638 | 2/1976 | Terayama et al. | 310/348 |
| 3,980,911 | 9/1976 | English | 310/348 X |
| 4,005,321 | 1/1977 | Shibata et al. | 310/348 |
| 4,035,674 | 7/1977 | Oguchi et al. | 310/320 |
| 4,054,807 | 10/1977 | Terayama | 310/348 |
| 4,069,434 | 1/1978 | Kawai | 310/348 |

*Primary Examiner*—Mark O. Budd
*Attorney, Agent, or Firm*—Margaret M. Parker; James W. Gillman

[57] ABSTRACT

A crystal plate is mounted on a pedestal area of an inverted bridge structure positioned within a depressed area of a crystal carrier. The plate is supported on the upper surface of the carrier until the wire bonding process is complete, then the ends of the bridge are forced down against support pins on the carrier and are welded into place. As the ends of the bridge are forced down, the center portion of the bridge is raised, elevating the crystal plate above the carrier surface for free vibration.

6 Claims, 3 Drawing Figures

MOUNTING ARRANGEMENT FOR CRYSTAL ASSEMBLY

BACKGROUND OF THE INVENTION

This invention relates to the field of crystal mounting, particularly to mounting crystals bearing complex circuitry.

Many crystal mounting methods have been devised to solve the twin problems of providing firm support during the wire bonding process while allowing the desired vibrational mode. Since in the past most crystals have required only two contacts, most of the solutions were relatively simple, typically either edge-mounted, as a beam, or center-mounted with a contact at the center of each surface.

As crystal applications became more sophisticated, as when used in filter networks, more contact points were required. As the operating frequency increases, the size of the crystal plate usually decreases. At the present, crystal applications may require as many as five non-grounded contacts on a one-fourth inch (0.6 centimeters) diameter plate and, no doubt, more will be required in the future.

High mass contacts such as solder bonds being no longer practicable, new bonding methods have been devised. At present, ultrasonic "scrubbing" is the foremost method, and involves a tool or machine which carries a spool of extremely fine wire. When the tool comes down upon a metal or metallized contact pad, an end of the wire is molecularly bonded to the pad by a combination of pressure and vibration. The tool then lifts, feeding out wire as it moves, then comes down the secoond contact pad and makes the second bond. The tool may then break off the wire bond from the wire still on the spool. It is obvious that the process requires that the crystal be supported at the bonding point in order for pressure to be applied. However, if the contact pads on the crystal were permanently supported, this would provide so much damping that the crystal would be unusable.

One solution was shown in a co-pending application Ser. No. 33,774, filed Apr. 27, 1979, and a divisional application derived from that application, Ser. No. 180,761, filed Aug. 25, 1980, and also now pending, assigned to the same assignee as is the present invention. The claimed solution was to support the crystal plate essentially on a small, very low pedestal on a substrate with ground connections made via the pedestal. Opposing pairs of active electrodes were located intermediate the center and the edge of the plate. Non-grounded electrodes were coupled by conductive strips on the crystal to pads near the crystal edge. During the bonding process, the wire bond was made first to a pad on the substrate, then the tool was lifted and brought down gently on a pad near the edge of the crystal, forcing the crystal down against the supporting substrate. The second bond was made with the crystal in this deformed but supported position. As the tool lifted, the crystal resumed planar form with no excessive damping. Since this method has the potential of stressing the crystal and the conductive areas, another mounting structure was needed which would also allow the crystal to be supported during the bonding process but free during operation.

SUMMARY OF THE INVENTION

It is therefore an object of the present invention to provide an improved means of mounting a crystal plate and providing support for the contact pads during the bonding process, but allowing free vibration of the crystal during operation.

This object and others are provided in a structure wherein the crystal carrier is formed with a "well" area in the upper surface and a number of contact pins. The crystal plate with conductive areas formed thereon is conductively attached to an inverted, metal bridge structure which forms an electrical connection to one or more conductive areas on the bottom surface of the crystal plate. The bridge has end portions which angle upward from the center portion. The bridge/crystal assembly is positioned in the carrier with the bridge portion in the well and the crystal resting on the upper surface of the carrier. The angled end portions of the bridge rest on metal pins which ultimately will support the bridge/crystal assembly. Conventional wire bonds are made between the contact pins on the carrier and the contact pads on the crystal plate. Then, pressure is applied to both inclined bridge portions simultaneously, forcing them down to a flat position on the support pins, and the bridge is welded to the pins. The center of the bridge is thus automatically elevated and the crystal plate lifted off the surface of the carrier.

DETAILED DESCRIPTION OF A PREFERRED EMBODIMENT

Figure 1:
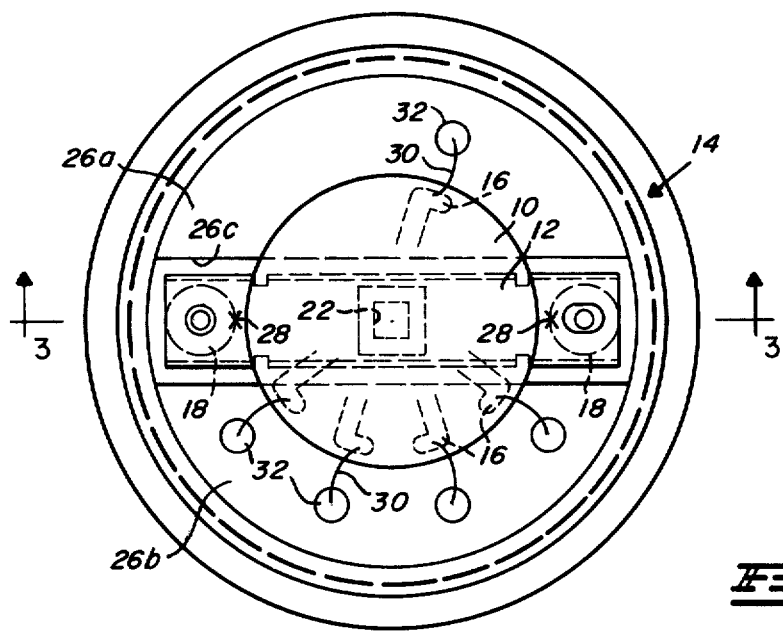
FIG. 1 is a top plan view of an assembly according to the invention, with the center portion of the crystal rendered invisible.

In the top view, FIG. 1, of an embodiment of the present invention, a crystal plate 10 is shown on an inverted bridge span 12 in a crystal carrier 14. A portion of the center of the crystal 10 has been rendered invisible to make other portions of the structure more clear.

The preferred embodiment of the invention was developed for use in a circuit requiring a resonator and a three-section resonator filter network on a single crystal plate having a diameter of approximately 0.25 inches (0.6 centimeters). Each active circuit element consists of a pair of opposing electrodes (not shown) on the crystal, energy being stored in that portion of the crystal between and closely adjacent the electrodes. The electrodes are preferably positioned intermediate the center of the plate and the edges. The ground side of each circuit element is coupled through a conductive strip and bonding pad (not shown) to the bridge 12 as will be explained below. The "high" side of each circuit element is coupled through a conductive strip (not shown) to a bonding pad 16 near the edge of the crystal plate. A more detailed and complete layout of the crystal conductive areas is shown in the above-referenced co-pending patent application. For the purpose of this application, only the bonding pads 16 of the five upper electrode connections are shown.

The inverted bridge structure is the key to this successful bonding process since, in combination with the crystal carrier, it provides the needed combination of support for the crystal plate during the bonding process and the freedom required during circuit operation. In the preferred embodiment, the bridge structure includes three parts, the inverted span 12 and two supports which may be Kovar (TM) pins 18. The bridge span 12 is also preferably made of Kovar and is formed as a shallow, inverted U-shaped strip with up-bent end portions 12a, 12b. The end portions and center portion are collinear along the longitudinal axis of the span. The side walls of the bridge span may include notches 19 for easier bending. In the middle of the bridge span 12 an area 20 is formed. The area 20, which may be square as shown in FIG. 1, is elevated above the remainder of the bridge span to serve as a pedestal support for the crystal. The crystal 10 could be cemented to the area 20 if desired. However, the crystal circuit design may require a conductive connection between the contacts on the bottom surface of the crystal and the support structure. If so, the preferred means of connection would be ribbon bonding (similar to wire bonding). An aperture 22 would be formed in the center of the area 20. With the crystal 10 inverted, the bridge span 12 would be inverted and placed into position on the crystal. A ribbon bond would then be made, preferably from a point on the underside of the elevated area 20 near the aperture 22 and extending across the aperture to a point on the opposite side, with one or more bonds as desired made to the crystal through the aperture. With the crystal/bridge span structure assembled, the structure is positioned on the carrier 14.

The carrier 14 is an open-bottomed, inverted Kovar cup 24 with a molded glass insert 26. Other carriers could be utilized, as long as the proper insulating qualities are provided. The upper surface of the glass 26 has two portions 26a, 26b which are flush with the bottom of the can 24, and a depressed area or "well" 26c. The well 26c contains the heads of the bridge support pins 18 and is slightly longer and wider than the bridge span 12. The depth of the well 26c should be sufficient to allow the crystal plate 10 to rest on the surfaces 26a, 26b during the wire bonding process. The crystal/bridge span assembly should be firmly positioned during the wire bonding process and this may be done in any suitable way; e.g., the heads of the bridge support pins 18 may include very small positioning pins 18b to mate with small holes or slots 12c in the end portions 12a, 12b of the bridge span, or the glass surfaces 26a, 26b may include a shoulder or rim (not shown) for abutting the edge of the crystal plate 10. Also, each end portion of the bridge span 12 may contain a slight dimple at the points 28 (at "x" in FIG. 1) for receiving a portion of the edge of the respective support pin 18 during the bonding period.

When the crystal/bridge assembly has been positioned in the well 26c, wire bonds 30 are made in the customary fashion between the pads 16 on the crystal 10 and a like number of terminal pins 32 molded into the glass insert 26. The pins 32 will be positioned near the outer edge of the surfaces 26a, 26b and near, but not covered by, the crystal 10. The pins are preferably made of Kovar. The wire bonds are of an extremely fine wire (preferably gold or aluminum) and are normally formed in an arch as shown to reduce transmission of vibration to the crystal.

Figure 2:
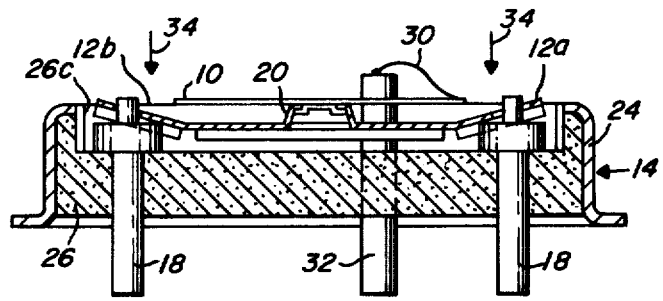
FIG. 2 is a sectional view along the line 2—2 of FIG. 1 after wire bonding is completed and before welding is completed.
Figure 3:
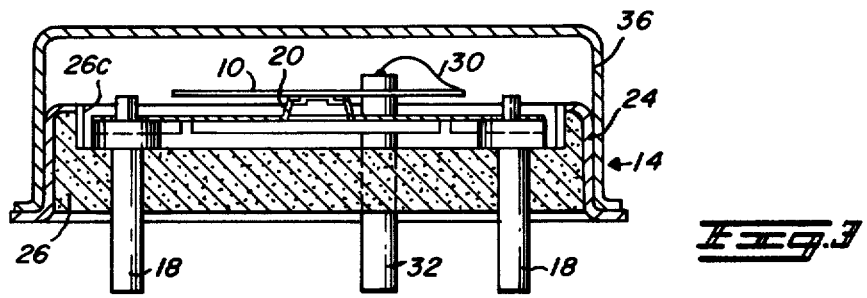
FIG. 3 is a sectional view along the line 2—2 of FIG. 1 after the welding process is completed.

When the wire bonds are completed, the assembly appears as in FIG. 2, with the up-bent ends 12a, 12b of the bridge span 12 resting on the heads of the support pins 18. A pair of welding tools (not shown) are brought down simultaneously on the bridge ends 12a, 12b in the direction of the arrows 34 and sufficient pressure is applied to force the end portions flat against the heads of the pins 18, thus lifting the center portion of the bridge span until the entire span surface is in the plane of the pin heads. The welding tool welds the span to the pins in this coplanar position and the crystal 10 remains permanently supported above the glass surfaces 26a, 26b allowing free, undamped vibration of all crystal areas except the small central area bonded to the bridge span.

In the usual application, a protective cover 36 will be placed over the "inverted cup" carrier 14 and, possibly, the space under the cover will be evacuated and hermetically sealed.

There has been shown and described a structure for supporting a crystal plate requiring a plurality of wire bonds on a surface thereof, and providing a firm support at the wire bonding sites during the bonding process, but allowing the crystal to vibrate freely during actual operation. This has been accomplished by mounting the crystal on an inverted bridge span which allows the bonding sites to be supported by the carrier. After bonding is complete, the span ends are forced down and welded onto bridge supports, thus the center of the span is lifted and the attached crystal is elevated above the carrier surface. Many variations and modifications of the inventive concept are possible and it is intended to cover all such as fall within the spirit and scope of the appended claims.

What is claimed is:

1. A crystal mounting arrangement comprising in combination:
    a crystal plate having a plurality of conductive areas on a first surface thereof;
    a conductive bridge span member having three connected collinear portions, the end portions having a first, angled position and a second, coplanar position, relative to the center portion, and the center portion having an elevated section, the crystal plate being attached to the elevated section;
    two bridge support members for supporting the bridge span member, without fixed attachment when the end portions of the span member are in the first position and fixedly attached to the span member when the span end portions are in the second position;
    a non-conductive carrier having a depressed portion dimensioned to receive and support the bridge structure with portions of the attached crystal plate resting on the upper surface of the carrier when the bridge span ends are in the first position;
    a plurality of conductive terminal means supported by the carrier and positioned beyond and adjacent the edge of the plate; and
    a plurality of wire bonds each conductively attached at one end to a respective one of the conductive terminals on the carrier and conductively attached at the other end to a respective one of the conductive areas on the upper surface of the crystal, the bonds having been made while the bridge span ends are in the first position and the crystal is supported on the carrier surface.

2. A crystal mounting arrangement in accordance with claim 1 and wherein the crystal plate has at least one conductive area on the second surface thereof and said areas are conductively attached to the bridge span, and further wherein the bridge support members are formed of a conductive material to provide terminal connections for said areas on the second surface of the plate.

3. A crystal mounting arrangement in accordance with claim 1 and wherein the bridge span member is an inverted U-shaped channel having notches in the side walls between the center section and the end portions.

4. A crystal mounting arrangement in accordance with claim 1 and wherein the elevated section of the bridge span member includes a central aperture and the lower surface of the crystal plate is bonded to the bridge span through said aperture.

5. A crystal mounting arrangement in accordance with claim 1 and further including a protective cover means and the non-conductive carrier is retained within the protective cover means.

6. A crystal mounting arrangement in accordance with claim 5 and wherein the protective cover means comprises a metal cup having an aperture in the bottom and a metal cover, and wherein the non-conductive carrier is a glass insert in the metal cup.

* * * * *